United States Patent [19]

Behr et al.

[11] Patent Number: 4,910,583

[45] Date of Patent: Mar. 20, 1990

[54] SEMICONDUCTOR BODY WITH HEAT SINK

[75] Inventors: Wolfgang Behr, Thalfingen; Karl Strohm; Johann F. Luy, both of Ulm, all of Fed. Rep. of Germany

[73] Assignee: Licentia Patent-Verwaltungs GmbH, Frankfurt, Fed. Rep. of Germany

[21] Appl. No.: 201,734

[22] Filed: Jun. 2, 1988

[30] Foreign Application Priority Data

Jun. 4, 1987 [DE] Fed. Rep. of Germany ....... 3718684

[51] Int. Cl.[4] .............................................. H01L 23/02
[52] U.S. Cl. ......................................... 357/81; 357/71; 357/68; 357/13
[58] Field of Search ......................... 357/81, 71, 13, 68

[56] References Cited

U.S. PATENT DOCUMENTS

| 4,091,408 | 5/1978 | Lee et al. ............................... 357/56 |
| 4,340,900 | 7/1982 | Goronkin ........................... 357/81 X |
| 4,374,394 | 2/1983 | Camisa .................................... 357/81 |

FOREIGN PATENT DOCUMENTS

| 0079265 | 5/1983 | European Pat. Off. . |
| 0154431 | 9/1985 | European Pat. Off. . |
| 0167948 | 1/1986 | European Pat. Off. . |
| 2046514 | 11/1980 | United Kingdom . |
| 2067354 | 7/1981 | United Kingdom . |

OTHER PUBLICATIONS

Goldwasser et al., "Highly Reliable Pulsed GaAs Read Diodes", Proceedings of the 5th Biennial Cornell Electrical Engineering Conference, Aug. 19-21, 1975, Ithaca, N.Y., U.S.A., pp. 367-376.

*Primary Examiner*—William Mintel
*Attorney, Agent, or Firm*—McGlew & Tuttle

[57] ABSTRACT

The invention relates to a semiconductor body, which is composed of at least one semiconductor device, especially one impatt-diode, with integrated heat sink. The series of semiconductor layers, out of which the semiconductor device is produced, is made up of one first $p^+$-doped semiconductor layer, which has the function of an etching stop layer, of a contact layer and a buffer layer at the same time.

10 Claims, 1 Drawing Sheet

SEMICONDUCTOR BODY WITH HEAT SINK

FIELD AND BACKGROUND OF THE INVENTION

The invention relates in general to semiconductors and in particular to a new and useful semiconductor body.

The invention is suitable especially for the semiconductor devices, which are fashioned as impact diodes. Such semiconductor devices are used for the production of mm-wave transmitters.

The construction of the semiconductor bodies, which are composed of one semiconductor device unit and a heat sink, is carried out in hybrid fabrication method as well as in n integrated fabrication method Discrete semiconductor devices, especially impact diodes comprising a separate heat sink are inserted into hybrid RF-circuit arrangements (Lit: E.Kaspar et al, IEEE Trans. Electron. Dev., Vol. ED-34, No 5, 1987).

Such a hybrid fabrication method of semiconductor bodies has the disadvantage to be very expensive and time consuming, which affects especially the industrial mass production.

In the U.S. Pat. No. 40 91 408 a fabrication of an impatt diode comprising an integrated heat sink is described, the structure of the impatt diode is produced in the substrate by an implantation of ions. The production of the device structure unit in the substrate by implantation of ions has the disadvantage, that an additional, suitably structured layer of oxide must be brought onto the substrate. Another disadvantage lies in the fact that thin layers of semiconductor cannot be produced by the procedure of the implantation of ions.

SUMMARY OF THE INVENTION

The invention provides a monolithic semiconductor body, which is integrable, for mm-wave transmitters, and which is inexpensive, technically simple and easy to understand.

One advantage of the invention lies in the fact that several semiconductor devices can be produced out of the series of semiconductor layers, grown onto the semiconductor substrate, and in that complicated, monolithic, integrated circuits can be built up.

Furthermore it is advantageous, that the semiconductor structures are grown epitaxially with very thin semiconductor layers, which are almost free of defects, and thus mm-wave devices such as impatt diodes can be produced with a quasi-read-structure for example, for frequencies exceeding 60 GHz.

Accordingly, it is an object of the invention to provide a semiconductor body which includes a semiconductor device and a heat sink attached to the semiconductor device and being integrated therewith and which includes a plurality of semiconductor layers grown on a semiconductor substrate to form a semiconductor device, the layer series including at least a first semiconductor layer grown onto the semiconductor substrate and being doped in such a way that the first semiconductor layer comprises at least one of either an etching stop layer and/or a buffer layer.

A further object of the invention is to provide a semiconductor body which is simple in design, reliable in construction and economical to manufacture.

The various features of novelty which characterize the invention are pointed out with particularity in the claims annexed to and forming a part of this disclosure.

For a better understanding of the invention, its operating advantages and specific objects obtained by its uses, reference is made to the accompanying drawings and descriptive matter in which preferred embodiments of the invention are illustrated.

DESCRIPTION OF THE PREFERRED EMBODIMENT

Figure 1:
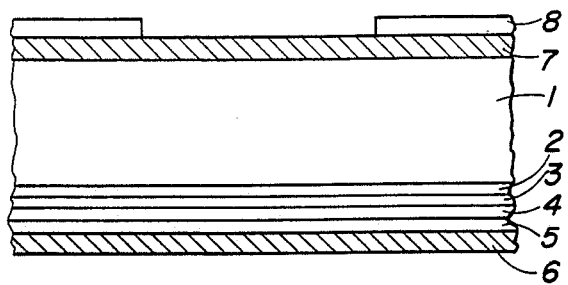
FIGS. 1 through 3 are sectional views showing production of the inventive semiconductor body.

Referring to the drawings in particular the invention embodied therein comprises a semiconductor substrate 1 which is integrated with a heat sink 9 to form a semiconductor body. The semiconductor substrate is covered by a plurality of semiconductor layers such as layers 2,3,4,5.

Pursuant to FIG. 1 on a highly resistive silicon (Si-) substrate (3000 $\Omega$cm), which is thinned and polished to a final thickness of 200 $\mu$m at both sides, a semiconductor layers series is grown epitaxially. In order to produce for example a double-drift-impatt diode the series of semiconductor layers is made up of — one $p^+$- doped Si-layer 2 with a thickness of 2.0 $\mu$m and a charge carrier concentration of more than $7 \times 10^{19}$ cm$^{-3}$, — one p-doped Si-layer 3 with a thickness of 0.35 $\mu$m and a charge carrier concentration of about $2 \times 10^{17}$ cm$^{-3}$, — an n-doped Si-layer 4 showing a thickness of 0.35 $\mu$m and a charge carrier concentration of more than $2 \times 10^{17}$ cm$^{-3}$, — an $^+$- doped Si-layer 5 showing a thickness of 0.2 $\mu$m and a charge carrier concentration of more than $2 \times 10^{19}$ cm$^{-3}$.

As doping material for the $p^+$doped layer 2 Boron is used, for the p-doped Si-layer 3 Gallium, and for the n-doped Si-layers 4,5 Antimony is used.

A first metallization layer is brought onto the series of semiconductor layers and a second semiconductor metallization layer 7 is brought onto the side of the semiconductor substrate 1, opposite to the series of layers. The metallization layers 6 and 7 are composed of an adhesion layer of Titanium (0.1 $\mu$m thickness) and a layer of gold (0.3 $\mu$m thickness) for example.

Figure 2:
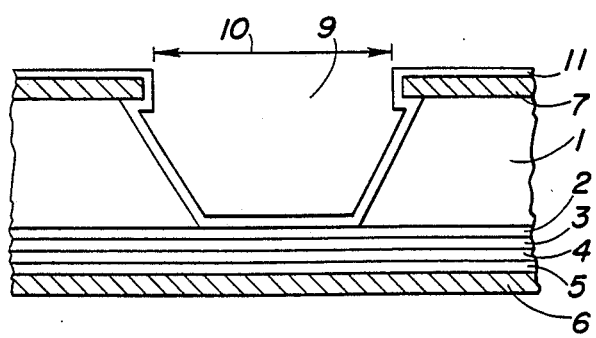

For the production of the heat sink 9 a photo resist varnish layer 8 is applied onto the second metallization layer and by suitable etching methods a window 10 is made in the second metallization layer 7. Eventually the photo resist layer 8 is removed. The Si-substrate 1 is etched with an anisotropic etching, for example KOH. The etching process stops at the $p^+$doped Si-layer 2, which, due to its high doping concentration acts as an etching-stop layer. The anisotropic etching makes the etching process to be carried out faster vertically to the surface of the substrate than parallel to the surface of the substrate. Thus a heat sink 9 with the shape of a truncated pyramid is formed (FIG. 2).

A third metallization layer 7 is applied onto the wall of the heat sink 9 and onto the second metallization layer 7, which is composed of an adhesive layer of 0.1 $\mu$m out of chrome and a gold layer of 0.1 $\mu$m. Eventually the heat sink 9 is electroplated with a heat conducting metal, for example gold. In order to guarantee a suitable contacting of the back side of the semiconductor device 12, the third metallization layer 11 is electroplated with gold.

Figure 3:
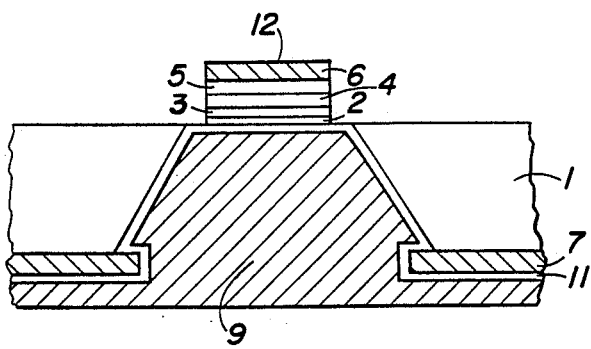

The structure of the semiconductor device 12, for example as a double-drift-impatt diode in mesa-construction method is carried out under known photo lithographic and etching procedures (FIG. 3).

In the case of the integrated fabrication method the semiconductor device 12 is exactly adjustable onto the heat sink 9, because the gold filling of the heat sink 9 is visible through the thin epitaxial semiconductor layers.

A further example of embodiment of the semiconductor device 12 is to be found in that the first layers of the series of semiconductor layers described above is composed of a p+doped Si-layer 2, which however is not only doped with Boron, but with Boron and Germanium. The thickness of the layer of this p+-doped Si-layer 2 amounts to about $2\mu m$ and the Boron-doping concentration is higher than $7 \times 10^{19}$ cm$^{-3}$.

Compared to silicon (with a covalent radius of 0.117 nm) the high Boron-concentration causes, due to the smaller covalent radius of Boron (0.088nm), high tensions and mismatch dislocations (staggerings) in the p+-doped Si-layer 2 and thus causes a higher occurrence of defects in the epitaxial growth of the following active Si-layer 3,4 and 5. Defect free an tension free semiconductor layers can be produced by inserting at the same time atoms showing a bigger covalent radius than Silicon, for example Germanium, which is electrically inactive and shows a covalent radius of 0.122nm.

The following Si-layers 3,4 and 5 can be grown defect free advantageously on such tension-compensated and defectless semiconductor layers. By doing this, the Si-layer 2, which is doped with Boron and Germanium, has the effect of a buffer between the semiconductor substrate and the following semiconductor layers 3, 4, 5. Furthermore the Boron and Germanium-doped Si-layer 2, owing to the high doping of Boron, shows a very low etching rate for the anisotrope etching as for example for KOH and is very advantageous for use as an etching stop layer when a heat sink 9 is produced. In addition to this, owing to the high Boron concentration a good ohmic contact with a low series resistance to the semiconductor device 12 can be obtained.

The doping of Si-layers with Boron and Germanium in order to produce semiconductor layers without tension is described in the DE-OS 3425 063.

The inventive semiconductor body is structured in such a way, that the integrated semiconductor device, for example a double-drift-impatt diode is to be contacted from both sides. The first metallization layer 6 is fashioned as a front side contact of the semiconductor device. The back side of the semiconductor device is to be contacted over the p+-doped Si-layer 2 and the third metallization layer 11 which is electroplated with gold.

The inventive semiconductor body is monolithically integratable into the circuit arrangements, especially RF-circuits. Impatt diodes with the described p+pnn+-structure (double drift diodes) or with a p+nn+: structure (single drift diodes) or with a quasi-read-structure p+pn+nn+can be used as monolithically integrated semiconductor devices.

An impatt diode with quasi-read-double-drift-structure is composed for example of a series of semi-conductor layers which is made up of one p+-doped Si-layer with a thickness of 1.5 $\mu m$ and a charge carrier concentration of $10^{20}$ cm$^{-3}$, a p-doped Si-layer with a thickness of 0.42 $\mu m$ and a charge carrier concentration of $1.1 \times 10^{17}$ cm$^{-3}$ an n -doped Si-layer with a thickness of 35 $\mu m$ and a charge carrier concentration of $10^{18}$ cm$^{-3}$, an n-doped Si-layer with a thickness of 0.27 $\mu m$ and a charge carrier concentration of $0.6 \times 10^{17}$ cm$^{-3}$ and an n+-doped Si-layer of a thickness of 0.2 $\mu m$ and a charge carrier concentration of $3 \times 10^{19}$ cm$^{-3}$.

The contacting and the production of the corresponding heat sinks for such a quasi-read-double-drift-diode is carried out as described above. For the production of a series of semiconductor layers without defects it is preferable, to dope the p+-doped Si-layer with Boron and Germanium for the above-mentioned reasons.

The series of semi-conductor layers are grown by the silicon molecular beam epitaxy technique.

The invention is not restricted to the described examples of embodiment, but the series of semiconductor layers for the production of a semiconductor device can comprise for example a Si-SiGE super lattice. Besides the series of semiconductor layers can be built up of III/V semiconductor compounds.

While specific embodiments of the invention have been shown and described in detail to illustrate the application of the principles of the invention, it will be understood that the invention may be embodied otherwise without departing from such principles.

What is claimed is:

1. A semiconductor body, comprising:
   a semiconductor substrate;
   a semiconductor component fabricated from a plurality of semiconductor layers grown on a substrate, said substrate defining a window extending completely through said substrate; and
   a heat sink disposed in said window extending completely through said substrate up to a first semiconductor layer of said plurality of semiconductor layers.

2. A semiconductor body according to claim 1, wherein said semiconductor substrate is formed of silicon having a resistivity of at least 3,000 $\Omega cm$.

3. A semiconductor body according to claim 1, wherein a first layer of said plurality of semiconductor layers is a p+-doped Silicon layer.

4. A semiconductor body according to claim 2, wherein the p+-doped Silicon layer is doped with Boron.

5. A semiconductor body according to claim 3, wherein the p+-doped Silicon layer is doped with Boron and Germanium.

6. A semiconductor body according to claim 1, wherein a first metallization layer is disposed on said semiconductor component opposite said semiconductor substrate and a second metallization layer is disposed on said semiconductor substrate opposite said semiconductor component.

7. A semiconductor body according to claim 6 wherein a window is formed in said second metallization layer, said window defined by said semiconductor substrate being etched to terminate at a p+-doped layer of Silicon of said semiconductor component, said heat sink being formed of conducting metal filling up said window.

8. A semiconductor body according to claim 1, wherein said heat sink is formed of Gold.

9. A semiconductor body according to claim 1, wherein said semiconductor body is formed as an impatt diode.

10. A semiconductor body according to claim 1, wherein a semiconductor body is formed integrally and monolithically with an RF circuit.

* * * * *